United States Patent
Gerhard et al.

(10) Patent No.: US 11,626,707 B2
(45) Date of Patent: Apr. 11, 2023

(54) SEMICONDUCTOR LASER DIODE

(71) Applicant: OSRAM OLED GmbH, Regensburg (DE)

(72) Inventors: Sven Gerhard, Alteglofsheim (DE); Christoph Eichler, Donaustauf (DE); Alfred Lell, Maxhuette-Haidhof (DE); Bernhard Stojetz, Wiesent (DE)

(73) Assignee: OSRAM OLED GMBH, Regensburg (DE)

( * ) Notice: Subject to any disclaimer, the term of this patent is extended or adjusted under 35 U.S.C. 154(b) by 186 days.

(21) Appl. No.: 17/193,951

(22) Filed: Mar. 5, 2021

(65) Prior Publication Data
US 2021/0249839 A1 Aug. 12, 2021

Related U.S. Application Data

(63) Continuation of application No. 16/471,330, filed as application No. PCT/EP2017/084144 on Dec. 21, 2017, now Pat. No. 11,011,887.

(30) Foreign Application Priority Data

Dec. 29, 2016 (DE) .......................... 102016125857.1

(51) Int. Cl.
*H01S 5/042* (2006.01)
*H01S 5/22* (2006.01)
(Continued)

(52) U.S. Cl.
CPC ........ *H01S 5/04254* (2019.08); *H01S 5/0282* (2013.01); *H01S 5/0425* (2013.01);
(Continued)

(58) Field of Classification Search
CPC .. H01S 5/04254; H01S 5/0282; H01S 5/0425; H01S 5/2031; H01S 5/22;
(Continued)

(56) References Cited

U.S. PATENT DOCUMENTS

| 4,441,187 A | 4/1984 | Bouley et al. |
| 6,239,490 B1 | 5/2001 | Yamada et al. |

(Continued)

FOREIGN PATENT DOCUMENTS

| CN | 1503416 A | 6/2004 |
| CN | 101017959 A | 8/2007 |

(Continued)

*Primary Examiner* — Yuanda Zhang
(74) *Attorney, Agent, or Firm* — Slater Matsil, LLP

(57) ABSTRACT

In an embodiment a semiconductor laser diode includes a semiconductor layer sequence comprising an active layer having a main extension plane, the semiconductor layer sequence configured to generate light in an active region and radiate the light via a light-outcoupling surface, wherein the active region extends from a rear surface opposite the light-outcoupling surface to the light-outcoupling surface along a longitudinal direction in the main extension plane and a continuous contact structure directly disposed on a surface of the semiconductor layer sequence, wherein the contact structure comprises in at least a first contact region a first electrical contact material in direct contact with the surface region and in at least a second contact region a second electrical contact material in direct contact with the surface region, wherein the first and second contact regions adjoin one another.

12 Claims, 8 Drawing Sheets

(51) Int. Cl.
  *H01S 5/028* (2006.01)
  *H01S 5/20* (2006.01)
(52) U.S. Cl.
  CPC ............. *H01S 5/2031* (2013.01); *H01S 5/22* (2013.01); *H01S 5/2222* (2013.01); *H01S 5/04252* (2019.08); *H01S 5/04253* (2019.08)
(58) Field of Classification Search
  CPC ............. H01S 5/2222; H01S 5/04252; H01S 5/04253; H01S 5/2036; H01S 2301/18; H01S 5/32341
  See application file for complete search history.

(56) References Cited

U.S. PATENT DOCUMENTS

| | | | |
|---|---|---|---|
| 7,072,374 | B2 | 7/2006 | Matsumura |
| 7,483,463 | B2 | 1/2009 | Son et al. |
| 9,281,656 | B2 | 3/2016 | Mueller et al. |
| 9,673,590 | B2 | 6/2017 | Avramescu et al. |
| 11,011,887 | B2 * | 5/2021 | Gerhard ................ H01S 5/2222 |
| 2003/0138981 | A1 | 7/2003 | Yamaguchi et al. |
| 2004/0185599 | A1 | 9/2004 | Harle et al. |
| 2006/0039428 | A1 | 2/2006 | Kondou |
| 2006/0081868 | A1 | 4/2006 | Kotani |
| 2009/0146308 | A1 | 6/2009 | Shiozawa et al. |
| 2010/0284434 | A1 | 11/2010 | Koenig et al. |
| 2011/0051766 | A1 | 3/2011 | Reill et al. |
| 2012/0058585 | A1 | 3/2012 | Maegawa et al. |
| 2013/0308667 | A1 | 11/2013 | Hagino et al. |
| 2015/0194788 | A1 | 7/2015 | Mueller et al. |
| 2016/0126699 | A1 | 5/2016 | Hirao |
| 2016/0190386 | A1 | 6/2016 | Nishioka |
| 2019/0013649 | A1 | 1/2019 | Vierheilig et al. |

FOREIGN PATENT DOCUMENTS

| | | |
|---|---|---|
| CN | 101604052 A | 12/2009 |
| CN | 101960682 A | 1/2011 |
| DE | 102008014092 A1 | 7/2009 |
| DE | 102012106687 A1 | 2/2014 |
| DE | 102012111512 A1 | 5/2014 |
| DE | 102016106949 A1 | 10/2017 |
| JP | S5753990 A | 3/1982 |
| JP | H03196689 A | 8/1991 |
| JP | H03201495 A | 9/1991 |
| JP | H06085384 A | 3/1994 |
| JP | 2003031894 A | 1/2003 |
| JP | 2006165277 A | 6/2006 |
| JP | 2011508440 A | 3/2011 |
| JP | WO2012101686 A1 | 8/2012 |
| WO | 2017055287 A1 | 4/2017 |
| WO | 2017178219 A1 | 10/2017 |

* cited by examiner

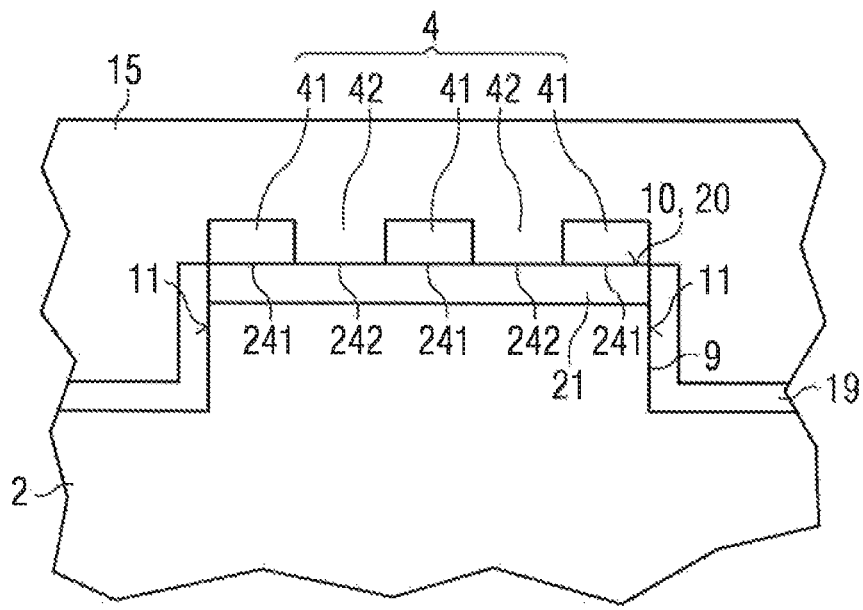
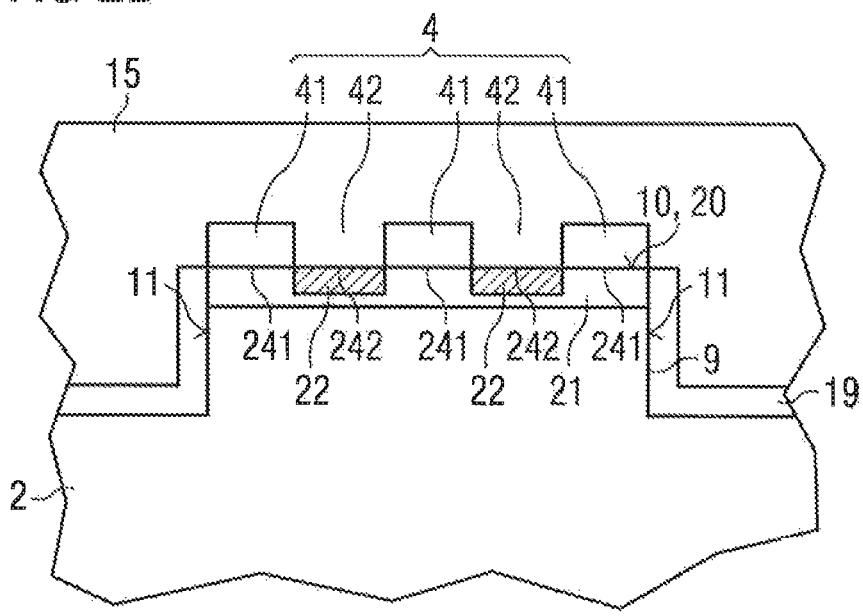

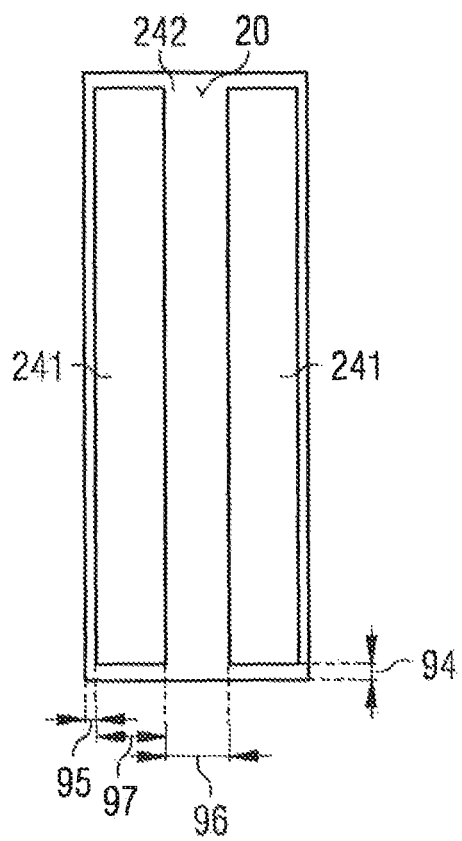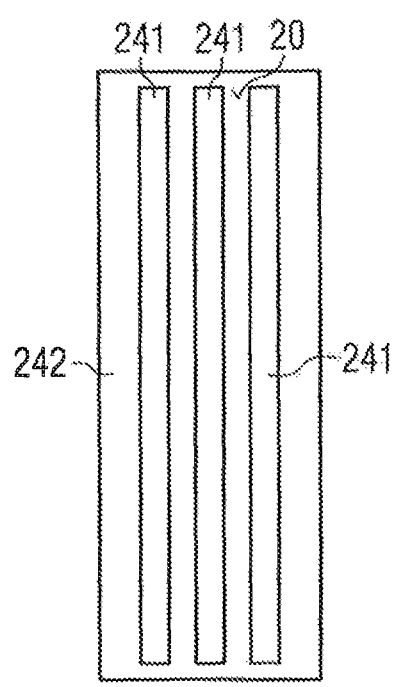

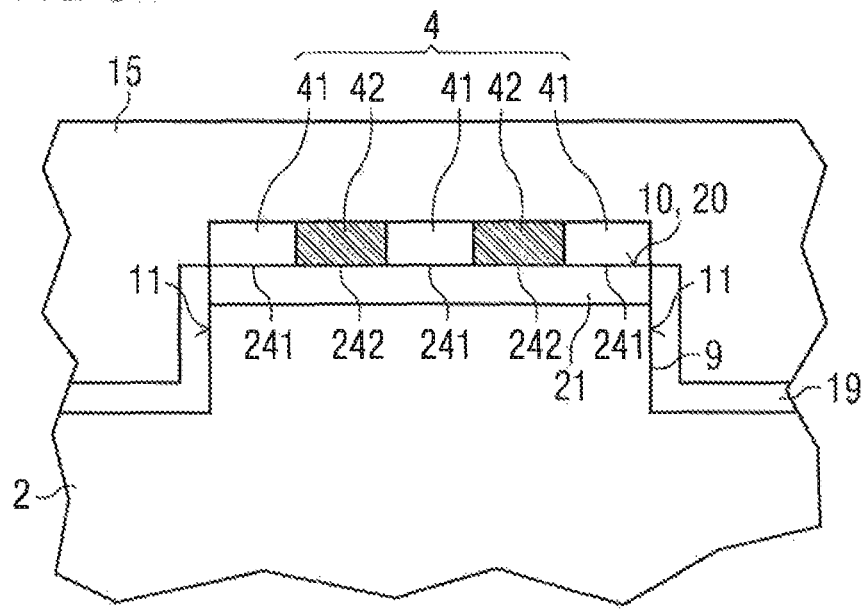
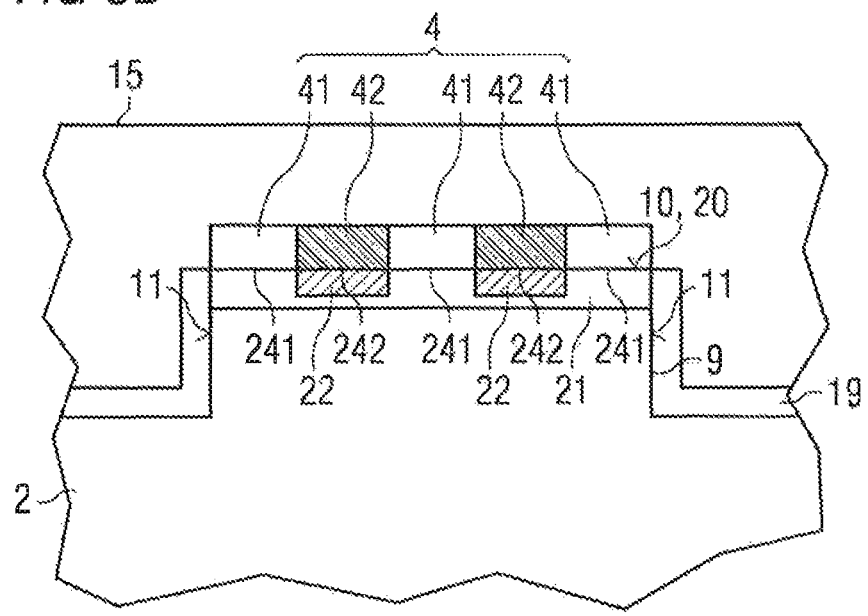

SEMICONDUCTOR LASER DIODE

CROSS-REFERENCE TO RELATED APPLICATIONS

This is a continuation application of U.S. application Ser. No. 16/471,330, entitled "Semiconductor Laser Diode," which was filed on Jun. 19, 2019, which is a national phase filing under section 371 of PCT/EP2017/084144, filed Dec. 21, 2017, which claims the priority of German patent application 102016125857.1, filed Dec. 29, 2016, all of which are incorporated herein by reference in its entirety.

TECHNICAL FIELD

A semiconductor laser diode is specified.

BACKGROUND

In modern high-power semiconductor lasers with a ridge waveguide structure, several modes are guided not only longitudinally but also laterally in the ridge waveguide structure region, hereinafter also referred to as ridge region. The light intensity on the facets, which results from the sum of all oscillating modes, is therefore not homogeneously distributed over the entire facet region: The different intensities of the individual modes at different positions on the facets result in regions with a higher intensity and areas with lower intensity, which depend considerably on the embodiment of the epitaxially grown structure and the chip design. High intensity areas, in particular, can lead to reliability problems. Since the facet load can become very high locally in such areas, this can lead to a material failure, a so-called COD ("catastrophic optical damage"). Local hole burning can also reduce the efficiency of such lasers.

SUMMARY OF THE INVENTION

Embodiments provide a semiconductor laser diode.

According to at least one embodiment, a semiconductor laser diode has at least one active layer which is intended and embodied to generate light in an active region during operation of the laser diode. In particular, the active layer may be part of a semiconductor layer sequence comprising a plurality of semiconductor layers and may have a main extension plane perpendicular to an arrangement direction of the layers of the semiconductor layer sequence. Furthermore, the semiconductor laser diode has a surface region, on which a continuous contact structure is directly applied. The contact structure is thus arranged in direct contact with the surface region of the semiconductor layer sequence and directly adjoins the semiconductor material of the semiconductor layer sequence without any further intermediate material.

For example, the active layer can have exactly one active area. The active area can be defined at least partially by a contact surface of the contact structure with the semiconductor layer sequence, i.e., at least partially by a surface over which current is injected into the semiconductor layer sequence and thus into the active layer. Furthermore, the active region can also be defined at least partially by a ridge waveguide structure, i.e., by a ridge formed in the form of an elongated elevation in the semiconductor material of the semiconductor layer sequence.

According to a further embodiment, in a method for manufacturing a semiconductor laser diode an active layer is produced which is embodied and intended to generate light, especially in the infrared to ultraviolet spectrum, during operation of the semiconductor laser diode. In particular, a semiconductor layer sequence can be produced with the active layer. Furthermore, a contact structure is applied directly to a surface region of the semiconductor layer sequence. The embodiments and features described above and below equally apply to the semiconductor laser diode and to the method for manufacturing the semiconductor laser diode.

According to a further embodiment, the semiconductor laser diode has a light-outcoupling surface and a rear surface opposite the light-outcoupling surface. The light-outcoupling surface and the rear surface can be in particular side surfaces of the semiconductor laser diode, which can also be called facets. During operation, the semiconductor laser diode can emit the light generated in the active area via the light-outcoupling surface. Suitable optical coatings, in particular reflective or partially reflective layers or layer sequences, which can form an optical resonator for the light generated in the active layer, may be applied to the light-outcoupling surface and to the rear surface. The active area can extend between the rear surface and the light-outcoupling surface along a direction which here and in the following is referred to as the longitudinal direction. The longitudinal direction can in particular be parallel to the main extension plane of the active layer. The arrangement direction of the layers on top of each other, i.e., a direction perpendicular to the main extension plane of the active layer, is referred to here and in the following as the vertical direction. A direction perpendicular to the longitudinal direction and perpendicular to the vertical direction is referred to here and in the following as the transversal direction or lateral direction. The longitudinal direction and the transversal/lateral direction can thus span a plane parallel to the main extension plane of the active layer.

The semiconductor layer sequence can in particular be embodied as an epitaxial layer sequence, i.e., as an epitaxially grown semiconductor layer sequence. The semiconductor layer sequence can be based on InAlGaN, for example. InAlGaN-based semiconductor layer sequences include in particular those in which the epitaxially produced semiconductor layer sequence generally comprises a layer sequence of different individual layers which contains at least one individual layer which comprises a material from the III-V compound semiconductor material system $In_xAl_yGa_{1-x-y}N$ with $0 \leq x \leq 1$, $0 \leq y \leq 1$ and $x+y \leq 1$. In particular, the active layer can be based on such a material. Semiconductor layer sequences that have at least one active layer based on InAlGaN can, for example, emit electromagnetic radiation in an ultraviolet to green wavelength range.

Alternatively or additionally, the semiconductor layer sequence can also be based on InAlGaP, which means that the semiconductor layer sequence can have different individual layers, of which at least one individual layer, e.g., the active layer, comprises a material made of the III-V compound semiconductor material system $In_xAl_yGa_{1-x-y}P$ with $0 \leq x \leq 1$, $0 \leq y \leq 1$ and $x+y \leq 1$. Semiconductor layer sequences which have at least one active layer based on InAlGaP can, for example, preferably emit electromagnetic radiation with one or more spectral components in a green to red wavelength range.

Alternatively or additionally, the semiconductor layer sequence may also comprise other III-V compound semiconductor material systems, such as an InAlGaAs-based material, or II-VI-compound semiconductor material systems. In particular, an active layer of a light-emitting semiconductor chip comprising an InAlGaAs based material may be capable of emitting electromagnetic radiation having one or more spectral components in a red to infrared wavelength range.

A II-VI compound semiconductor material may have at least one element from the second main group, such as Be, Mg, Ca, Sr, and one element from the sixth main group, such as O, S, Se. For example, the following materials belong to the II-VI compound semiconductor materials: ZnO, ZnMgO, CdS, ZnCdS, MgBeO.

The active layer and, in particular, the semiconductor layer sequence with the active layer can be deposited on a substrate. The substrate may comprise a semiconductor material, such as a compound semiconductor material system mentioned above, or other material. In particular, the substrate may comprise or be made of sapphire, GaAs, GaP, GaN, InP, SiC, Si, Ge and/or a ceramic material such as SiN or AlN. For example, the substrate can be embodied as a growth substrate on which the semiconductor layer sequence is grown. The active layer and in particular a semiconductor layer sequence with the active layer can be grown on the growth substrate by means of an epitaxial process, for example, by means of metalorganic vapor phase epitaxy (MOVPE) or molecular beam epitaxy (MBE), and, furthermore, be provided with electrical contacts. Furthermore, it may also be possible that the growth substrate is removed after the growth process. The semiconductor layer sequence can, for example, also be transferred to a substrate embodied as a carrier substrate after growth.

For example, the active layer may have a conventional pn-junction, a double heterostructure, a single quantum well structure (SQW structure), or a multiple quantum well structure (MQW structure) for light generation. The semiconductor layer sequence may include, in addition to the active layer, further functional layers and functional regions, such as p- or n-doped charge carrier transport layers, i.e., electron or hole transport layers, highly p- or n-doped semiconductor contact layers, undoped or p- or n-doped confinement, cladding or waveguide layers, barrier layers, planarization layers, buffer layers, protective layers and/or electrodes, and combinations thereof. Moreover, additional layers such as buffer layers, barrier layers and/or protective layers can also be arranged perpendicular to the growth direction of the semiconductor layer sequence, for example, around the semiconductor layer sequence, i.e., on the side surfaces of the semiconductor layer sequence.

According to a further embodiment, the semiconductor laser diode has at least one first contact region and at least one second contact region, which adjoin one another and in which the contact structure is arranged in direct contact with the already previously described surface region of the semiconductor layer sequence. The contact structure has a first electrical contact material in the first contact region and a second electrical contact material in the second contact region. Since the first and second contact regions are directly adjacent to each other, the first and second electrical contact materials are also directly adjacent to each other. In other words, the first and second electrical contact materials are arranged in a common plane parallel to the surface region of the semiconductor layer sequence. Furthermore, the common plane can also be parallel to the main extension plane of the active layer. The first and second electrical contact materials are thus directly adjacent to each other in the longitudinal and/or transversal direction. Accordingly, the surface region in directly adjacent regions is covered by the first and second contact material.

Although a first and a second contact region with a first and a second contact material are described above and in the following, the semiconductor laser diode may also have more than two contact regions, e.g., at least a first, a second and a third contact region, in which different contact materials, e.g., a first, a second and a third contact material, are arranged in direct contact with the surface region of the semiconductor layer sequence and form a coherent contact structure. Furthermore, four or more different contact materials can also be arranged in corresponding contact regions. The features and embodiments described above and in the following in connection with the first and second contact regions and the first and second contact materials equally apply to more contact regions and contact materials.

According to a further embodiment, the first and second contact materials differ with regard to their electrical contact resistances to the semiconductor layer sequence. In other words, the first electrical contact material has a first electrical contact resistance to the surface region of the semiconductor layer sequence, while the second electrical contact material has a second electrical contact resistance to the surface region, and the first contact resistance is different from the second contact resistance. Particularly preferably, at least one of the two electrical contact materials or both electrical contact materials form, with the surface region of the semiconductor layer sequence, an electrical contact which has an ohmic characteristic. Alternatively or in addition to the different contact resistances, the first contact material may have a first electrical conductivity and the second contact material may have a second electrical conductivity, which are different from each other.

By means of the different electrical contact resistances and/or the different electrical conductivities of the electrical contact materials of the contact structure, it can be achieved that the current injection in at least one first contact region differs from the current injection in at least one second contact region. In the surface region of the semiconductor layer sequence that is intended for power connection and that is electrically contacted by the contact structure, the current is not injected homogeneously during operation of the semiconductor laser diode. Rather, the current injection is locally varied, which can lead to a differently strong pumping of individual modes in the active area, which can thus be specifically prevented from oscillating or whose oscillation can be specifically supported. The contact structure described here allows the mode behavior of the semiconductor laser diode to be specifically controlled, for example, to homogenize an intensity distribution in the active area and thus also on the light-outcoupling surface, which can lead to an increase in efficiency and reliability.

In comparison thereto, it is known in the state of the art that parts of a homogeneous contact material applied over a large area are covered with an electrically insulating layer of a dielectric and that this layer is opened only in certain regions in which an electrical connection to an overlying bond pad can then be made. In this way, essentially only at the areas opened in the insulating layer current is injected, which can only be distributed over the surface region to be contacted due to the transverse conductivity of the contact material. This results in areas of the semiconductor far away from the openings being less energized than those directly under the openings. To a certain extent, this can also be used to control the mode dynamics. However, a considerable disadvantage of this design is that dielectrics generally have a lower thermal conductivity than metals, for example. Since modern power lasers are mounted practically without exception on a heat sink with the described contact region downwards, the use of such dielectrics leads to poor dissipation of the resulting heat loss and thus to a reduction in the service life and efficiency of the components.

With the contact structure described here, on the other hand, a desired locally different current injection can be achieved by a suitable selection of the electrical contact materials and by a suitable geometric arrangement of these on the surface region of the semiconductor layer sequence, without it being necessary in this context to electrically isolate parts of the contact structure from a bonding layer intended for external electrical connection. This allows a significantly better heat dissipation compared to the state of the art, which can lead to a further increase in efficiency and reliability.

According to a further embodiment, the semiconductor layer sequence is applied to a substrate and the surface region on which the contact structure is arranged is formed by at least part of a surface of the semiconductor layer sequence facing away from the substrate. Furthermore, the semiconductor layer having the surface region can in particular be part of a p-doped side of the semiconductor layer sequence, so that the contact structure is provided and arranged correspondingly for contacting the p-side of the semiconductor laser diode. If the semiconductor laser diode is mounted on a heat sink or other carrier, for example, with the p-side downwards, this is also referred to as p-down mounting. As explained above, the embodiment of the contact structure described here is advantageous for good heat dissipation, which can be particularly useful for p-down mounting. Alternatively, the side of the semiconductor layer sequence with the contact structure can also be an n-side.

According to a further embodiment, the semiconductor layer sequence has a ridge waveguide structure. The ridge waveguide structure can, for example, be formed on a side of the semiconductor layer sequence facing away from a substrate. The ridge waveguide structure can have a ridge top side and adjacent ridge side faces and can be manufactured in particular by removing part of the semiconductor material from the side of the semiconductor layer sequence facing away from the substrate. The ridge waveguide structure runs in a longitudinal direction and is bounded on both sides in the lateral direction by the ridge side faces and in the vertical direction by the ridge top side on the side facing away from the active layer. The ridge side faces as well as the remaining top side of the semiconductor layer sequence adjacent to the ridge waveguide structure can be covered, for example, by a passivation material. Due to the refractive index jump at the ridge side faces of the ridge waveguide structure because of the transition from the semiconductor material to the passivation material, a so-called index guidance of the light generated in the active layer can be effected, which can promote the formation of an active region. The surface region of the semiconductor layer sequence directly contacted by the contact structure can be formed by a part or preferably by the entire top side of the ridge. Alternatively, the semiconductor laser diode can also be embodied as a so-called broad area laser diode without a ridge waveguide structure, in which case the surface region directly contacted by the contact structure can be formed in particular by a part of a top side of the semiconductor layer sequence opposite a substrate. The remaining part of the top side can be covered by a passivation material.

According to a further embodiment, the surface region, which is electrically contacted by the contact structure, is formed by a semiconductor contact layer of the semiconductor layer sequence. The semiconductor contact layer can be formed by a highly doped semiconductor layer that forms a low electrical contact resistance to at least one of the electrical contact materials of the contact structure. If the contact structure is arranged on the p-side, the semiconductor contact layer can be a $p^+$-doped semiconductor layer in particular.

In accordance with a further embodiment, the semiconductor contact layer has a first electrical conductivity in the at least one first contact region and a second electrical conductivity, which is different from the first electrical conductivity, in the at least one second contact region. By different electrical conductivities in connection with the different electrical contact materials, the locally varying current injection can be additionally controlled. For example, the semiconductor contact layer can be regionally modified with regard to its material structure. In particular, the semiconductor contact layer may be modified in at least one first contact region or in at least one second contact region. The modification can be achieved, for example, by plasma treatment, by implantation with materials that reduce the electrical conductivity, such as hydrogen, by etching, or by treatment with wet chemical substances such as acids or alkaline solutions. The modified material structure may preferably extend from the surface region to a depth of greater than or equal to 0.1 nm and less than or equal to 50 nm. Such means can be used to reduce the electrical conductivity of the semiconductor contact layer in specific areas. Such a modification is particularly preferred in the contact region which is in direct contact with that electrical contact material that has a higher electrical contact resistance to the surface region or which has a lower electrical conductivity, so that an even more pronounced local variation of the current injection can be achieved. Furthermore, it may also be possible to locally increase the electrical conductivity of the semiconductor contact layer by suitable measures.

The geometric shapes of the at least one first contact region and the at least one second contact region and thus also those of the first and second contact materials can be selected in particular with regard to the desired mode control. Some particularly advantageous shapes can be given by strip shapes and island shapes. For example, the at least one first contact region and/or the at least one second contact region may be embodied in the form of one or more strips. Such a strip may, in particular, have a principal extension direction in the longitudinal direction. Furthermore, such a strip can have a constant or varying width along its course in the main extension direction. For example, such a strip can become wider or narrower towards the facets. Furthermore, for example, the at least one second contact region can enclose the at least one first contact region in the longitudinal and lateral direction. In this case, the first electrical contact material may have a lower electrical contact resistance to the surface region of the semiconductor layer sequence and/or a higher electrical conductivity than the second electrical contact material. In this case, the first contact region can also, for example, be island-shaped in the form of circular or differently shaped islands.

According to a further embodiment, the contact structure contacts the surface region of the semiconductor layer sequence in a plurality of first contact regions and/or in a plurality of second contact regions. The contact structure may thus have one or more regions with the first contact material and one or more regions with the second contact material, each of which regions may have characteristics as described above. In the case of a plurality of first contact regions, these can all be the same or different in terms of their geometric shape. Likewise, in the case of a plurality of second contact regions, these can all be the same or different in terms of their geometric shape.

According to a further embodiment, a bonding layer is applied over the contact structure, which is intended for an external electrical connection of the semiconductor laser diode. For example, the bonding layer can be used to solder the semiconductor laser diode onto a heat sink or other carrier. In particular, the bonding layer can directly contact at least partial regions or the entire contact structure or form part of the contact structure.

According to a further embodiment, one of the materials selected from the first contact material and the second contact material is part of the bonding layer that directly covers the other of the materials selected from the first contact material and the second contact material. For example, the first electrical contact material may be different from the bonding layer, while the second contact material is formed by a part of the bonding layer. In other words, the bonding layer in this case extends over the first contact material and also into regions between the regions with the first contact material. In this case, the contact structure is formed by a structured layer of the first contact material and that part of the bonding layer that directly contacts the surface region of the semiconductor layer sequence in the second contact regions.

According to a further embodiment, the first and second contact materials are different from the bonding layer. In this case, the contact structure is formed by a continuous layer which contacts the surface region directly over the entire surface and on which the bonding layer is applied in direct contact.

For manufacturing the contact structure, one of the contact materials, i.e., the first contact material or the second contact material, can be applied continuously over a large area. Using photo technology, the contact material can then be structured according to the associated contact regions. Furthermore, structured application using suitable masks and lift-off processes is also possible. The further contact material can then be applied in the exposed areas. For this purpose, one can also use one of the structuring methods mentioned above, for example.

The first and second contact materials may, in particular, be or comprise a metal, a metal alloy or metal mixture, or a transparent conductive oxide such as indium tin oxide (ITO) or zinc oxide (ZnO). The following materials in particular are advantageous for the contact structure and the bonding layer of the above-described embodiments: The first contact material may, for example, comprise or be one or more materials selected from Pd, Pt, ITO, ZnO, Ni and Rh. For example, the second contact material may comprise or be one or more materials selected from Pd, Pt, ITO, ZnO, Ni, Rh, Ti, Pt, Au, Cr, (Ti)WN, Ag, Al, Zn, Sn as well as alloys thereof, wherein the second contact material is different from the first contact material. For example, the bonding layer may comprise or be made of one or more materials selected from Ti, Pt, Au, Cr, (Ti)WN, Ag, Al and ITO, wherein, depending on the choice of material, the bonding layer material may also form the second contact material as well as be different from the first contact material. For example, the bonding layer can also comprise a layer stack with several layers of different materials, for example, a layer stack with layers of Ti, Pt and Au. The thickness of the contact structure can, for example, be determined by the thickness of the first contact material and can particularly preferably be greater than or equal to 20 nm and less than or equal to 120 nm. Smaller thicknesses are also possible. In particular, the first contact material may have the thickness of a complete monolayer layer or of a part of a monolayer, for example, in the case of Cr or other of the above materials. In addition, thicknesses greater than or equal to a monolayer and less than or equal to 20 nm are also possible.

BRIEF DESCRIPTION OF THE DRAWINGS

Further advantages, advantageous embodiments and further developments are revealed by the embodiments described below in connection with the figures, of which:

FIGS. 2A and 2B show schematic illustrations of semiconductor laser diodes according to further embodiments;

FIGS. 3A to 3F show schematic illustrations of semiconductor laser diodes according to further embodiments;

FIGS. 6A and 6B show schematic illustrations of semiconductor laser diodes according to further embodiments.

Figure 1A:
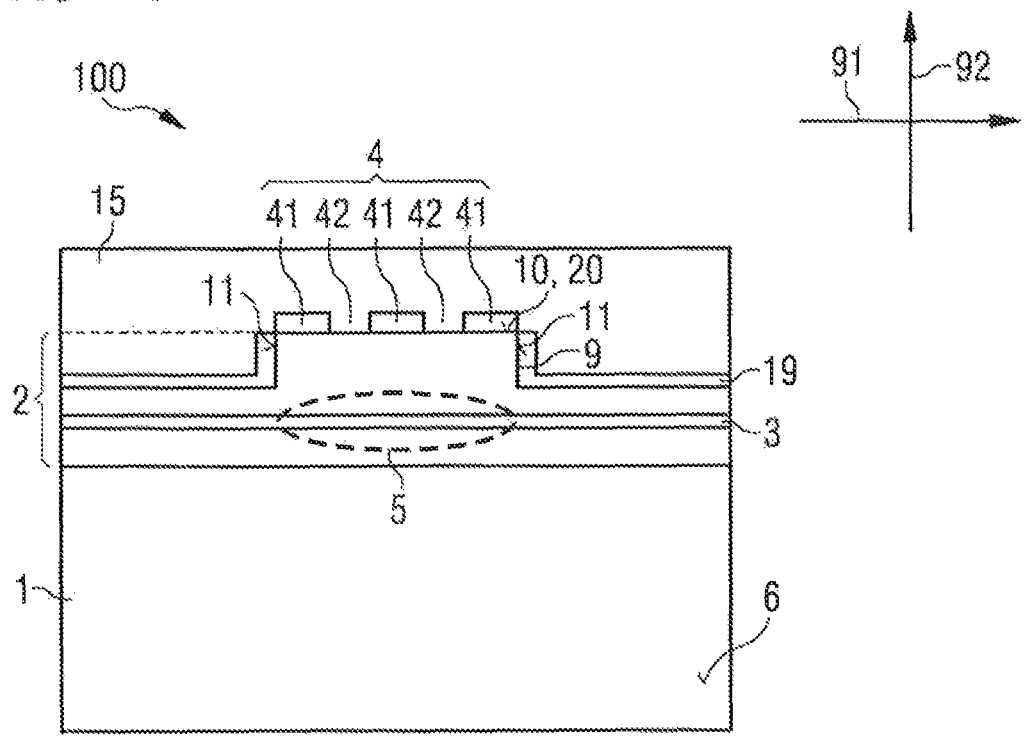
FIGS. 1A to 1D show schematic illustrations of semiconductor laser diodes according to several embodiments.

In the embodiments and figures, identical, similar or identically acting elements are provided in each case with the same reference numerals. The elements illustrated and their size ratios to one another should not be regarded as being to scale, but rather individual elements, such as for example, layers, components, devices and regions, may have been made exaggeratedly large to illustrate them better and/or to aid comprehension.

DETAILED DESCRIPTION OF ILLUSTRATIVE EMBODIMENTS

Figure 1B:
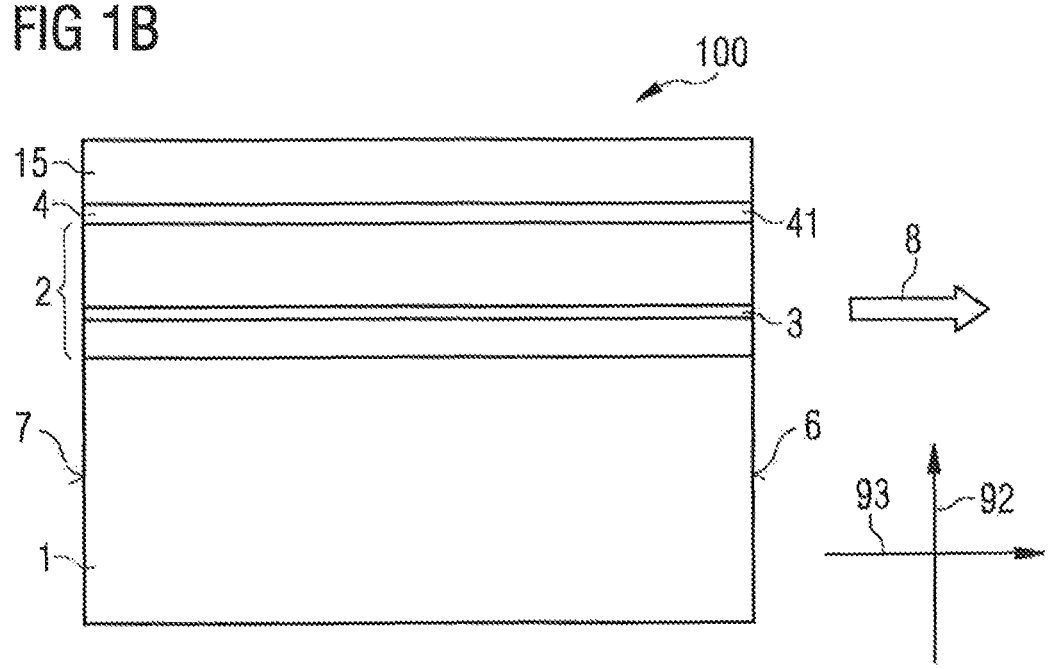
Figure 1C:
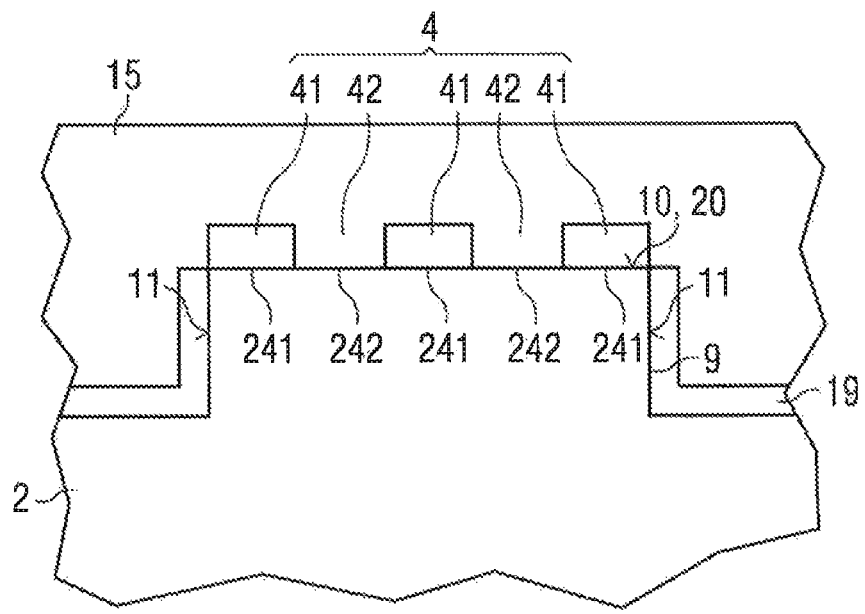

FIGS. 1A to 1C show an embodiment of a semiconductor laser diode 100, with FIG. 1A showing a view of the light-outcoupling surface 6 and FIG. 1B showing a section through the semiconductor laser diode 100 with a section plane perpendicular to the light-outcoupling surface 6. FIG. 1C shows a section of the view of FIG. 1A. The following description refers equally to each of FIGS. 1A to 1C.

The semiconductor laser diode 100 comprises a substrate 1, which is, for example, a growth substrate for a semiconductor layer sequence 2 epitaxially grown thereon. Alternatively, the substrate 1 can also be a carrier substrate to which a sequence of semiconductor layers 2 grown on a growth substrate has been transferred after growth. For example, the substrate 1 may comprise GaN or may be GaN, on which a semiconductor layer sequence 2 based on an InAlGaN compound semiconductor material has been grown. In addition, other materials, in particular as described in the general part, are also possible for the substrate 1 and the semiconductor layer sequence 2. Alternatively, it is also possible that the semiconductor laser diode 100 is free of a substrate. In this case, the semiconductor layer sequence 2 may have been grown on a growth substrate which has been subsequently removed. The semiconductor layer sequence 2 has an active layer 3, which is suitable for generating light 8 during operation, especially laser light when the laser threshold is exceeded, and emitting the light via the light-outcoupling surface 6. Furthermore, the semiconductor layer sequence 2 can be bonded to an auxiliary substrate after the growing substrate has been removed. This can preferably be done in p-side-down technology, preferably on a highly thermally conductive substrate. Possible substrate materials include silicon carbide, aluminum nitride, silicon, germanium, sapphire, diamond, diamond-like carbon (DLC) and Cu composite materials.

As indicated in FIGS. 1A and 1B, the transversal or lateral direction 91 is defined here and in the following as a direction which is parallel to a main extension direction of the layers of the semiconductor layer sequence 2 in a view onto the light-outcoupling surface 6. The arrangement direction of the layers of the semiconductor layer sequence 2 on top of each other and of the semiconductor layer sequence 2 on the substrate 1 is referred to here and in the following as the vertical direction 92. The direction perpendicular to the lateral direction 91 and to the vertical direction 92, which corresponds to the direction in which the light 8 is emitted, is referred to here and in the following as the longitudinal direction 93.

On a side of the semiconductor layer sequence 2 facing away from the substrate 1, a contact structure 4 is applied onto a surface region 20, wherein the contact structure 4 is designed for electrical contacting of the semiconductor layer sequence 2 and, in particular, for injecting current from the side of the semiconductor layer sequence 2 facing away from the substrate 1. The semiconductor laser diode 100 may have an additional electrode layer, which is not shown for reasons of clarity, for electrical contacting of the other side of the semiconductor layer sequence 2. In addition to the active layer 3, the semiconductor layer sequence 2 may comprise further semiconductor layers, such as cladding layers, waveguide layers, barrier layers, current spreading layers and/or current limiting layers, which are not shown to simplify the illustration.

Furthermore, the top side of the semiconductor layer sequence 2 facing away from the substrate 1, except for the surface region 20 in which the contact structure 4 contacts the semiconductor layer sequence 2, is covered with a passivation material 19 which, for example, can comprise or be an electrically insulating oxide, nitride or oxynitride, such as silicon dioxide, silicon nitride, silicon oxynitride, aluminum oxide, tantalum oxide, rhodium oxide, niobium oxide and/or titanium dioxide. Other oxides, nitrides and oxynitrides with one or more materials selected from Al, Ce, Ga, Hf, In, Mg, Nb, Rh, Sb, Si, Sn, Ta, Ti, Zn and Zr are also possible. Furthermore, reflective or partially reflective layers or layer sequences, which are also not shown for the sake of clarity and which are intended and embodied for the formation of an optical resonator in the semiconductor layer sequence 2, may be applied to the light-outcoupling surface 6 and the opposite rear surface 7, which form side surfaces of the semiconductor layer sequence 2 and of the substrate 1.

In the embodiment shown, a ridge waveguide structure 9 is formed in the top side of the semiconductor layer sequence 2 facing away from the substrate 1 by removing part of the semiconductor material from the side of the semiconductor layer sequence 2 facing away from the substrate 1. The ridge waveguide structure 9 runs in the longitudinal direction 93 and has a ridge top side 10 on the side facing away from the substrate 1, which forms the surface region 20 on which the contact structure 4 is applied in direct contact. Furthermore, the ridge waveguide structure 9 is limited in the lateral direction 91 on both sides by ridge side faces 11. The ridge side faces 11, like the adjacent top side regions, are also covered by the passivation material 19. Due to the refractive index jump at the ridge side surfaces 11 because of the transition from the semiconductor material to the passivation material 19, a so-called index guidance of the light generated in the active layer 3 can be effected, which together with the current injection can contribute to the formation of an active region 5, which indicates the region in the semiconductor layer sequence 2 in which the generated light is guided and amplified during laser operation. As shown in FIG. 1A, the ridge waveguide structure 9 can be formed by completely removing the semiconductor material laterally on both sides of the ridge. Alternatively, a so-called "tripod" can also be formed, in which the semiconductor material is removed laterally to the ridge only along two channels. In particular, these channels can extend from the light-outcoupling surface 6 to the rear surface 7. Furthermore, a structure known under the term "buried heterostructure" is also possible.

For the external electrical connection of the semiconductor laser diode wo, the semiconductor laser diode also comprises on and in electrical contact with the contact structure 4 a bonding layer 15, which can be applied over a large area, as can be seen in FIGS. 1A and 1B. For example, the bonding layer 15 may be intended and embodied for soldering the semiconductor laser diode wo onto a heat sink or another external carrier. By means of the passivation material 19 it can be achieved that only the contact structure 4 and thus only the intended surface region 20 is electrically contacted by the bonding layer 15. The side of the semiconductor layer sequence 2 facing the contact structure 4 can in particular be p-doped, so that a so-called p-down assembly of the semiconductor laser diode wo can be achieved by such soldering by means of the bonding layer 15.

The contact structure 4 is applied in direct contact to the surface region 20 and covers it continuously and in a large-area fashion. Particularly preferably, the entire surface region 20, thus in the embodiment shown the entire ridge top side 10, is covered with the contact structure 4. In particular, the semiconductor laser diode wo has at least one first contact region 241 and at least one second contact region 242 which are immediately adjoining one another and in which the contact structure 4 is arranged in direct contact with the surface region 20 of the semiconductor layer sequence 2. The contact structure 4 comprises in the first contact region 241 a first electrical contact material 41 and in the second contact region 242 a second electrical contact material 42, which are also immediately adjoining one another, so that the first and second electrical contact materials 41, 42 are arranged in a common plane parallel to the surface region 20 of the semiconductor layer sequence 2. In the embodiment shown, the contact structure 4 contacts the surface region 20 purely exemplarily in a plurality of first and second contact regions 241, 242, so that the contact structure 4 accordingly has several regions with the first and second contact materials 41, 42. Preferred geometric designs of the contact regions or contact materials are explained in connection with the following embodiments.

The first contact material 41 and the second contact material 42 differ with respect to their respective electrical contact resistances to the semiconductor layer sequence 2. The first electrical contact material 41 has a first electrical contact resistance to the surface region 20, while the second electrical contact material 42 has a second electrical contact resistance to the surface region 20, wherein the first contact resistance and the second contact resistance are different from each other. Alternatively or additionally, the contact materials 41, 42 can also differ in their respective electrical conductivities. As described in the general part, the current injection into the semiconductor layer 2 can be locally varied so that individual laser modes can be selectively amplified or suppressed in the active region. Accordingly, the mode behavior of the semiconductor laser diode wo can be controlled laterally and longitudinally by a suitable formation of the contact structure 4. In addition, as also described in the general part, a good thermal connection of the surface region 20 can be provided so that good heat dissipation can be achieved.

In the semiconductor laser diode wo described here, the first contact material 41 is structured. This can be done, for example, by a large-area application and a subsequent area-wise removal, in particular by photo technology. Alternatively, a structured application can be performed using appropriate mask and lift-off processes. By structuring the first contact material 41, the second contact regions 242 are kept free of the first contact material 41. The bonding layer 15 is applied directly and without an electrically insulating layer partially disposed therebetween and being customary in the state of the art to the structured first contact material 41 and, in particular in the second contact regions 242, directly to the surface region 20, and forms the second contact material 42 there. The electrical contact resistances of the contact materials 41, 42 in the shown embodiment are shown in particular selected such that the first contact resistance of the first contact material 41 to the surface region 20 is smaller than the second contact resistance of the second contact material 42 to the surface region 20. Alternatively or additionally, the electrical conductivities of the contact materials 41, 42 may be selected such that the first electrical conductivity of the first contact material 41 is greater than the second electrical conductivity of the second contact material 42. For example, the first contact material 41 may comprise or be Pd for this purpose, while the bonding layer 15 may comprise or be a Ti/Pt/Au metal layer stack, so that the second contact material 42 accordingly may comprise or be Ti. Alternatively or additionally other materials of those mentioned above in the general part are also possible.

Figure 1D:
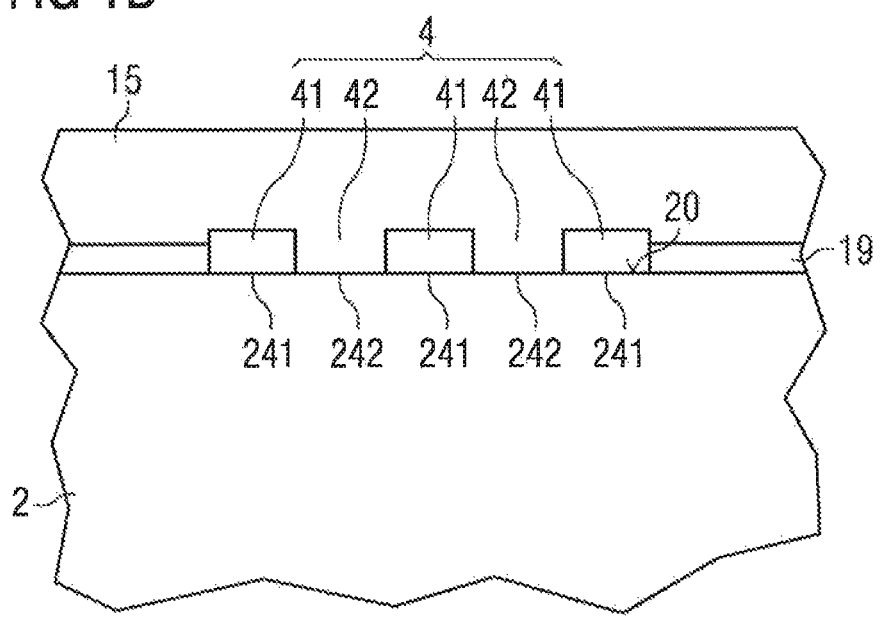

FIG. 1D shows another embodiment in which the semiconductor laser diode wo, compared to the embodiment shown in FIGS. 1A to 1C, is embodied as a so-called broad area laser diode without a ridge waveguide structure. The surface region 20 directly contacted by the contact structure 4 is defined by that part of the top side of the semiconductor layer sequence 2 which is not directly covered by the passivation material 19. The previous description concerning the contact structure 4 also applies to this embodiment.

In the following figures, modifications and further embodiments of the semiconductor laser diode 100 are shown on the basis of sections corresponding to the view of FIG. 1C, as well as on the basis of vertical views onto the surface region 20. Even though the further figures show semiconductor laser diodes with a ridge waveguide structure 9, the features described also apply to semiconductor laser diodes without a ridge waveguide structure.

In the embodiment shown in FIG. 2A, the semiconductor layer sequence 2 comprises a semiconductor contact layer 21 as the uppermost semiconductor layer. The top side of the semiconductor contact layer 21 facing away from the active layer 3 thus forms the surface region 20 contacted directly by the contact structure 4. The semiconductor contact layer 21 has a higher doping in comparison to the semiconductor layers directly underneath, so that the electrical contact resistance to the contact structure 4 can be lowered. If the side of the semiconductor layer sequence 2 facing the contact structure 4 is p-doped as described above, the semiconductor contact layer 21 is formed by $p^+$-GaN, for example.

FIG. 2B shows a further embodiment where the semiconductor contact layer 21 has regions with a modified material structure 22. The modified material structure is formed purely as an example in the second contact regions 242 and causes the electrical conductivity in these regions to be reduced in comparison with the regions without a modified material structure, so that in interaction with the different electrical contact resistances in the first and second contact regions 241, 242 and/or the different electrical conductivities of the first and second contact materials 41, 42 as described above the difference in the current injection in the first contact regions 241 and the second contact regions 242 can be increased. The modification may, for example, reach to a depth greater than or equal to 0.1 nm and less than or equal to 50 nm and be produced by plasma treatment, implantation with materials that reduce the electrical conductivity, such as hydrogen, or by etching, or by a treatment with wet chemical substances, such as acids or alkaline solutions. Furthermore, it may also be possible to increase the electrical conductivity locally by suitable measures.

FIGS. 3A to 3F show advantageous geometric designs of the first and second contact regions 241, 242 on the surface region 20, which also applies to the first and second electrical contact materials and which allow a desired particularly advantageous influence on the mode structure. It is also particularly advantageous for the shown configurations if the first contact material which is applied in the first contact regions 241 has a first contact resistance to the surface region 20 that is smaller than the second contact resistance which the second contact material that is applied in the second contact regions 242 has to the surface region 20 and/or if the first contact material 41 has a higher electrical conductivity than the second contact material 42.

FIGS. 3A and 3B show the first contact regions 241, which are strip-shaped. Preferably, the semiconductor laser diode has a strip-shaped first contact region or, as shown in FIG. 3A, two strip-shaped first contact regions 241 or, as shown in FIG. 3B, three strip-shaped first contact regions 241. However, more than three strip-shaped first contact regions are also possible. As shown, the strips have a main extension direction preferably in the longitudinal direction. The first contact regions 241 may be surrounded in the longitudinal and lateral directions by a continuous second contact region 242, so that in this case those regions of the surface region 20 which are adjacent to the facets and to the sides of the surface region 20, i.e., to the ridge side faces in the case of a ridge waveguide structure, are free of the first contact material. Alternatively, the strip-shaped first contact regions 241 may also extend as far as the facets and/or sides of the surface region 20, so that at least in the first case then also strip-shaped second contact regions 242 are formed on the surface region 20. Furthermore, strips running in the lateral direction are also possible, which can cause, for example, less strong pumping in the facet region or stronger or weaker pumping in the region at the light-outcoupling surface compared to the region at the rear surface.

FIG. 3A furthermore indicates distances 94, 95 and 96 of the first contact regions 241 to the edges of the surface region 20 and to each other as well as the strip width 97 in the lateral direction. Advantageous values for the distance 94 of the strips to the facets are greater than or equal to 5 µm and less than or equal to 50 µm, advantageous values for the distance 95 to the sides of the surface region 20, in the case of a ridge waveguide structure thus to the ridge side faces, are greater than or equal to 0 µm and less than or equal to 3 µm. Advantageous values for the lateral distance 96 of immediately adjacent first contact regions 241 are greater than or equal to 1 µm and less than or equal to 30 µm. Advantageous values for the lateral ridge width 97 are greater than or equal to 5 µm and less than or equal to 30 µm. Typical dimensions of the surface region 20, i.e., the ridge top side in the case of a ridge waveguide structure, may be a range of greater than or equal to 300 µm and less than or equal to 3 mm for the length in the longitudinal direction and a range of greater than or equal to 5 µm and less than or equal to 300 µm for the width in the lateral direction.

Figure 3C:
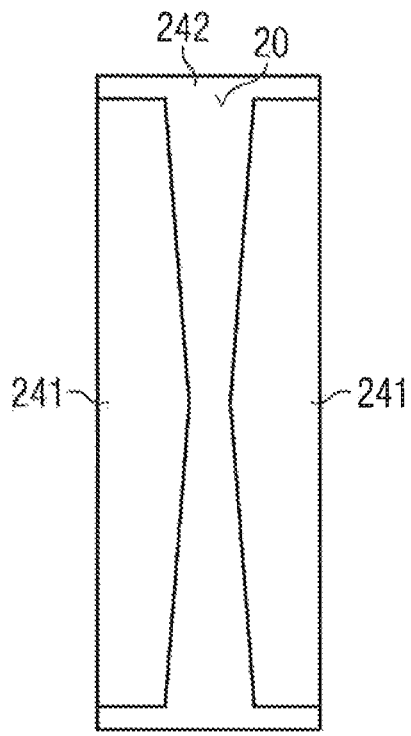
Figure 3D:
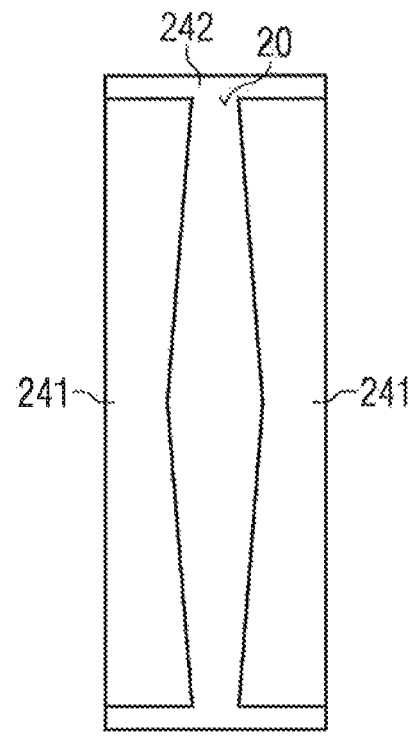

FIGS. 3C and 3D show designs in which the lateral width of the strips varies, i.e., increases or decreases when going from the facets in the longitudinal direction towards the center as shown. This allows the mode distribution to be independently adjusted close to the facets and in the center of the resonator. As an example, the strips extend in a lateral direction up to the side edges of the surface region 20.

Figure 3E:
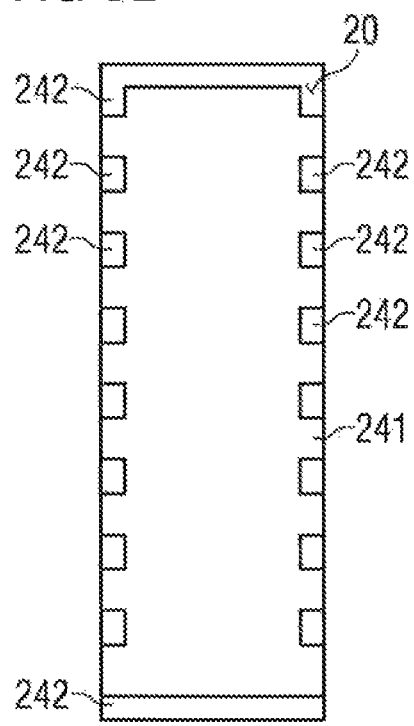

FIG. 3E shows a further embodiment of an advantageous geometric design of the first and second contact regions 241, 242, in which the width of the first contact region 241 varies in sections and, in particular, oscillates gradually over the entire length in the longitudinal direction.

Figure 3F:
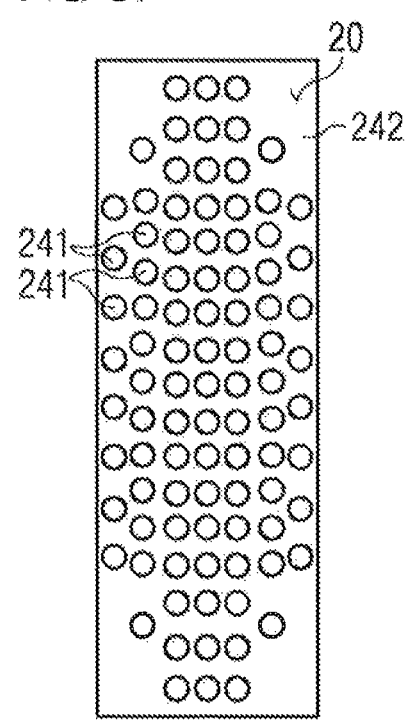

FIG. 3F shows another embodiment of an advantageous geometric design of the first and second contact regions 241, 242, in which a plurality of island-shaped first contact regions 241 is distributed over the surface region 20. The first contact regions 241 have a circular shape, preferably with a diameter of greater than or equal to 0.5 µm and less than or equal to 10 µm and a distance from each other of greater than or equal to 0.5 µm and less than or equal to 10 µm. The minimum distance of the first contact regions 241 from the facets and side edges of the surface region 20 are preferably greater than or equal to 0 µm and less than or equal to 30 µm. By a suitable choice of size, distribution density and distance of the first contact regions 241, which can be freely selected in the surface region 20, the current injection can be freely adjusted. As an alternative to the circular shape shown, the first contact regions 241 can also have other shapes, for example, other round or also polygonal shapes.

Figure 4:
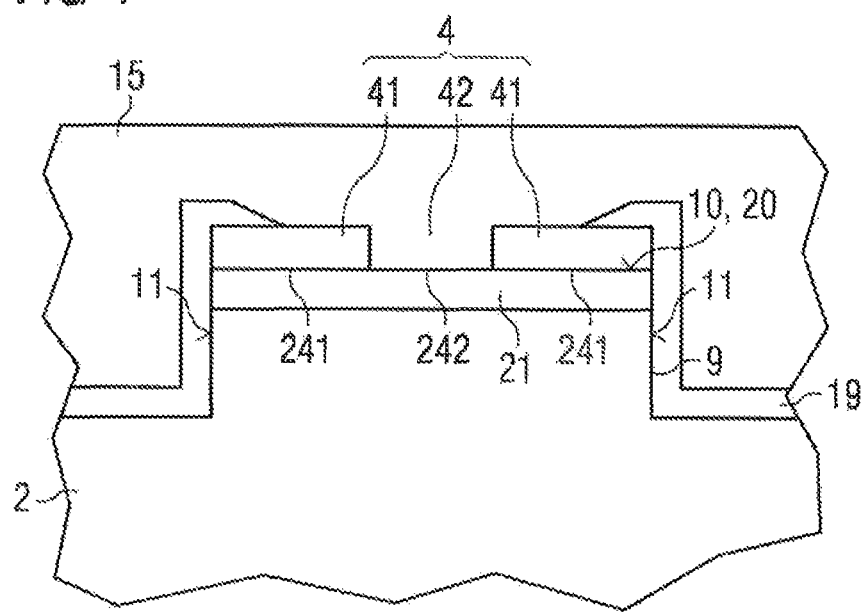
FIGS. 4 to 5C show schematic illustrations of semiconductor laser diodes according to further embodiments.

FIG. 4 shows another embodiment of a semiconductor laser diode in which the passivation material 19 partially extends between the contact structure 4 and the bonding layer 15, thus electrically isolating a part of the contact structure 4 from the bonding layer 15. In the embodiment shown, the passivation material 19 extends over the lateral side edges of the ridge waveguide structure 9 onto part of the first contact material 41. By means of this, thermal insulation of the side edge region of the ridge waveguide structure 9 can be achieved, which can promote a balanced temperature distribution in the ridge waveguide structure 9. Thus the formation of a thermal lens can be counteracted. Furthermore, current is injected into the lateral edge regions of the ridge waveguide structure 9 only depending on the transverse conductivity of the first contact material 41, so that this region can be supplied with less current. In this way, the oscillation of so-called side modes, i.e., intensity increases at the edges of the ridge waveguide, can be reduced or prevented. The overlap width of the passivation material 19 on the surface region 20 is preferably greater than or equal to 0.1 µm or greater than or equal to 0.5 µm and less than or equal to 5 µm or less than or equal to 20 µm.

Figure 5A:
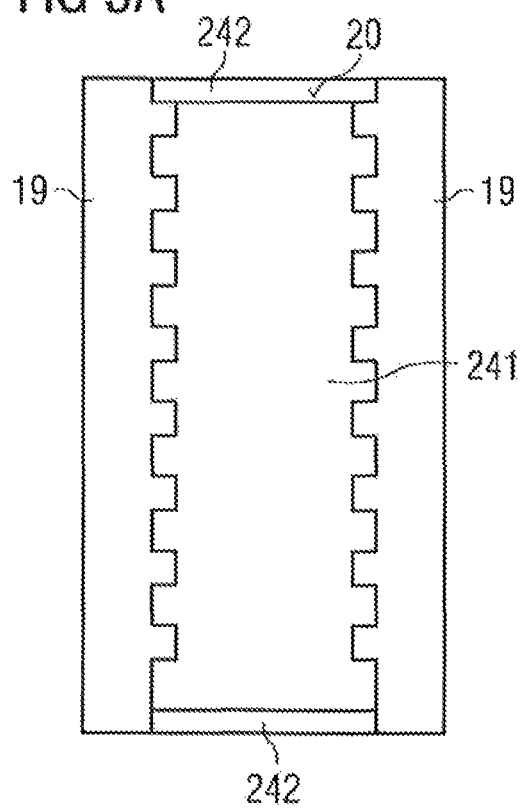
Figure 5B:
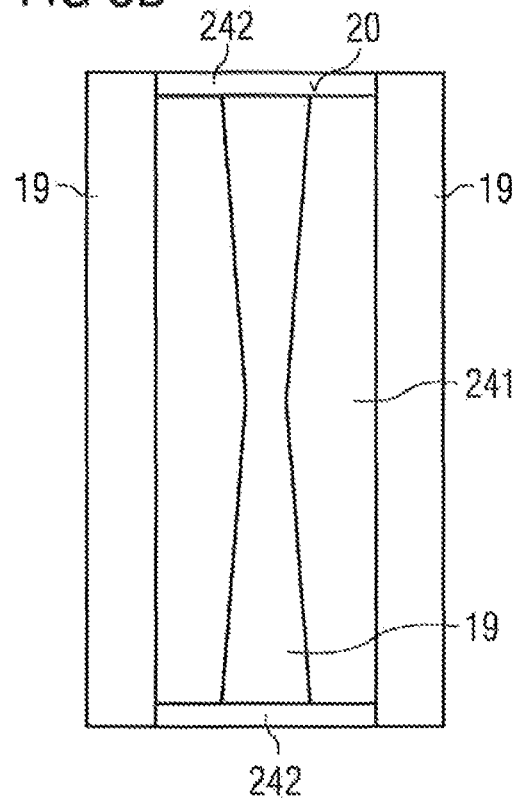
Figure 5C:
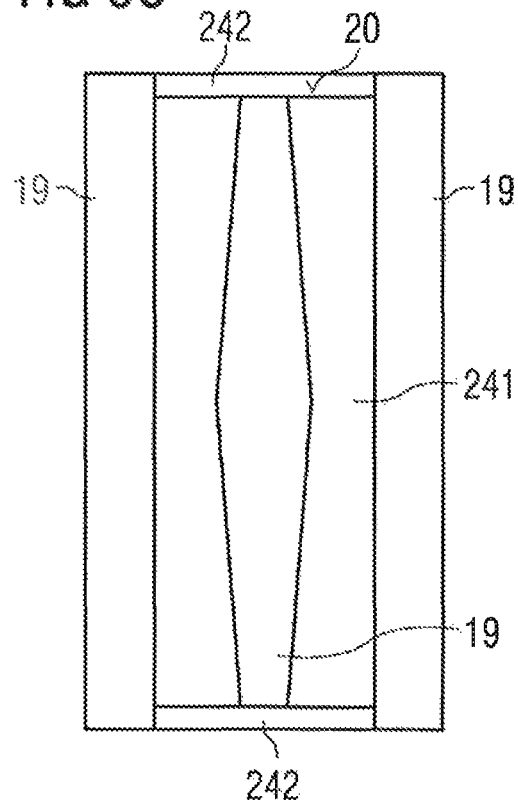

FIGS. 5A to 5C show several embodiments of advantageous arrangements of the passivation material 19 between the contact structure and the bonding layer, wherein the passivation material 19 can be arranged not only in the edge region but, as shown in FIGS. 5B and 5C, also in a central region. For the sake of clarity, FIGS. 5A to 5C show only the passivation material 19 on the surface region 20 with indicated first and second contact regions 241, 242. The embodiments shown in FIGS. 4 to 5C can be combined with all other embodiments shown.

FIGS. 6A and 6B show two embodiments of semiconductor laser diodes, which correspond to the embodiments shown above in connection with FIGS. 2A and 2B. In contrast to the previous embodiments, however, the contact structure 4 is formed by a continuous layer, which contacts the surface region 20 directly over the entire surface region and on which the bonding layer 15 is applied. The contact structure 4 has, in addition to the first contact material 41 in the first contact regions 241, a second contact material 42 in the second contact regions 242, which is different from the first contact material 41 and from the bonding layer 15. For this purpose, after the application of the first contact material 41, the regions of the surface region 20 not covered with the first contact material 41 are covered with the second contact material 42. The bonding layer 15 is afterwards applied immediately on top thereof. The materials listed above in the general part are suitable as materials for the first contact material 41, the second contact material 42 and the bonding layer 15.

Although only first and second contact regions with first and second contact materials are described in the embodiments shown, more than two different contact materials may be present in corresponding contact regions. The features and embodiments described in connection with the first and second contact regions and the first and second contact materials also apply to more contact regions and contact materials.

The embodiments shown in the figures and, in particular, the respective described features are not limited to the respective combinations shown in the figures. Rather, the shown embodiments as well as single features can be combined with one another, even if not all combinations are explicitly described. In addition, the embodiments described in connection with the figures may have alternative or additional features according to the description in the general part.

The invention is not limited by the description based on the embodiments to these embodiments. Rather, the invention includes each new feature and each combination of features, which includes in particular each combination of features in the patent claims, even if this feature or this combination itself is not explicitly explained in the patent claims or embodiments.

What is claimed is:

1. A semiconductor laser diode comprising:
   a semiconductor layer sequence comprising an active layer having a main extension plane, the semiconductor layer sequence configured to generate light in an active region and radiate the light via a light-outcoupling surface, wherein the active region extends from a rear surface opposite the light-outcoupling surface to the light-outcoupling surface along a longitudinal direction in the main extension plane; and
   a continuous contact structure directly disposed on a surface region of the semiconductor layer sequence, wherein the contact structure comprises in at least a first contact region a first electrical contact material in direct contact with the surface region and in at least a second contact region a second electrical contact material in direct contact with the surface region,
   wherein the first and second contact regions adjoin one another,
   wherein the first contact material and the second contact material form a continuous contact layer on which a bonding layer is located and/or one of the materials of the first contact material or the second contact material is part of a bonding layer covering the other of the materials of the first contact material or the second contact material, wherein the surface region is formed by a semiconductor contact layer of the semiconductor layer sequence, and wherein the semiconductor contact layer has a first conductivity in the first contact region and a second conductivity in the second contact region, the first conductivity being different from the second conductivity, and/or the semiconductor contact layer has a regionally modified material structure.

2. The semiconductor laser diode according to claim 1, wherein the first electrical contact material has a first electrical contact resistance to the surface region and the second electrical contact material has a second electrical contact resistance to the surface region, and wherein the first and second contact resistances are different from each other.

3. The semiconductor laser diode according to claim 1, wherein the first electrical contact material has a first electrical conductivity and the second electrical contact material has a second electrical conductivity, and wherein the first and second electrical conductivities are different from each other.

4. The semiconductor laser diode according to claim 1, wherein the semiconductor layer sequence is arranged on a substrate and the surface region is formed by at least a part of a surface of the semiconductor layer sequence facing away from the substrate.

5. The semiconductor laser diode according to claim 1, wherein the semiconductor layer sequence comprises a ridge waveguide structure having a ridge top side and ridge side faces adjacent thereto, and wherein the surface region is formed by the ridge top side.

6. The semiconductor laser diode according to claim 1, wherein the first contact region and/or the second contact region is/are formed as a strip.

7. The semiconductor laser diode according to claim 6, wherein the strip has a main extension direction in the longitudinal direction.

8. The semiconductor laser diode according to claim 6, wherein the strip has a varying width.

9. The semiconductor laser diode according to claim 1, wherein the second contact region encloses the first contact region.

10. The semiconductor laser diode according to claim 1, wherein the first contact region is island-shaped.

11. The semiconductor laser diode according to claim 1, wherein the contact structure electrically contacts the surface region in a plurality of first contact regions and/or second contact regions.

12. The semiconductor laser diode according to claim 1, wherein the first contact material and/or the second contact material is/are partially covered with a passivation material.

* * * * *